United States Patent [19]
Liu et al.

[11] Patent Number: 5,781,488
[45] Date of Patent: Jul. 14, 1998

[54] DRAM WITH NEW I/O DATA PATH CONFIGURATION

[75] Inventors: Lawrence C. Liu, Menlo Park, Calif.; Michael A. Murray, Bellevue, Wash.; Li-Chun Li, Los Gatos, Calif.

[73] Assignee: Mosel Vitelic Corporation, San Jose, Calif.

[21] Appl. No.: 844,541

[22] Filed: Apr. 18, 1997

[51] Int. Cl.$^6$ ............................................. G11C 7/02
[52] U.S. Cl. .................... 365/207; 365/205; 365/208
[58] Field of Search ............................ 365/207, 205, 365/208

[56] References Cited

U.S. PATENT DOCUMENTS

| | | | |
|---|---|---|---|
| 5,325,336 | 6/1994 | Tomishima et al. | 365/207 |
| 5,329,494 | 7/1994 | Suzuki et al. | 365/230.03 |
| 5,367,488 | 11/1994 | An | 365/189.01 |
| 5,383,159 | 1/1995 | Kubota | 365/207 |
| 5,473,576 | 12/1995 | Matsui | 365/230.06 |
| 5,600,603 | 2/1997 | McDaniel | 365/207 |
| 5,644,543 | 7/1997 | Kim et al. | 365/207 |
| 5,648,928 | 7/1997 | Yoon et al. | 365/63 |
| 5,668,766 | 9/1997 | Bramnik | 365/207 |
| 5,671,188 | 9/1997 | Patel et al. | 365/205 |

*Primary Examiner*—Viet Q. Nguyen
*Assistant Examiner*—Hien Nguyen
*Attorney, Agent, or Firm*—Skjerven, Morrill, MacPherson, Franklin & Friel; Michael Shenker

[57] ABSTRACT

In accordance with this invention, a DRAM with a staggered bitline sense amplifier configuration utilizes an I/O data path scheme which minimizes the time delay through the I/O data path. The DRAM includes a first and a second memory arrays wherein a first external sense amplifier receives on an input terminal a signal corresponding to the state of a memory cell selected from the first memory array via a first column decoding circuit. A second external sense amplifier receives on an input terminal a signal corresponding to the state of a memory cell selected form the second memory array via a second column decoding circuit. Each of the two external sense amplifiers has an output terminal which are shorted together. A tristate signal feeding another input terminal of each of the two external sense amplifiers is used to eliminate data contention on the shorted output terminals.

21 Claims, 4 Drawing Sheets

DRAM WITH NEW I/O DATA PATH CONFIGURATION

FIELD OF THE INVENTION

This invention relates to dynamic random access memories (DRAMs) and in particular to a DRAM with a staggered bitline sense amplifier configuration which utilizes a new I/O data path scheme to minimize the time delay through and simplify the I/O data path.

BACKGROUND

One DRAM configuration utilizes an even number (such as two or four for example) of memory arrays arranged in pairs, with bitline sense amplifiers placed between each pair. The DRAM 10 in FIG. 1 illustrates such configuration. A pair of memory arrays 11 and 12 are shown with bitline sense amplifiers 13-i in between. Each bitline sense amplifier is connected to two pairs of bitlines, one pair from each memory array. For example, bitline pairs 11-3 and 12-3 in memory arrays 11 and 12, respectively, are connected to bitline sense amplifier 13-3.

Each of the pairs of bitlines 11-i and 12-i is connected to the respective bitline sense amplifier 13-i via a pair of select transistors not shown. The select transistors are used to connect either the bitline pair 12-i in memory array 12 or the bitline pair 11-i in memory array 11 to the sense amplifier 13-i.

A column decoding circuit (not shown) is used to select one of the bitline sense amplifiers 13-i, and provide a connection between the output terminals of the selected bitline sense amplifier and the data bus lines $DB_n$ and $\overline{DB}_n$. The I/O sense amplifier 20 is used for further amplification of the signals on $DB_n$ and $\overline{DB}_n$ lines prior to transmitting these signals to an output buffer (not shown).

Accordingly, upon selection of a particular wordline in one of the memory arrays, a memory cell (representing one bit of information) from one of the two memory arrays 11 and 12 is selected. The state of the selected memory cell is sensed and signals representing this state are then provided on data bus lines $DB_n$ and $\overline{DB}_n$.

Another DRAM configuration, shown in FIG. 2, utilizes what is known as a staggered bitline sense amplifier architecture. Unlike the DRAM configuration shown in FIG. 1 wherein all bitline sense amplifiers are arranged between pairs of memory arrays, in FIG. 2 the bitline sense amplifiers (shown as 43-i, 44-i and 45-i) are arranged in a staggered configuration with respect to each memory array.

Bitline sense amplifiers 44-i are utilized in a similar manner to those in FIG. 1. Bitline sense amplifiers 44-i are located between and shared by the two memory arrays 41 and 42. Each of the bitline sense amplifiers 44-i is connected to two pairs of bitlines, one pair from each memory array. For example, bitline pairs 404A and 404B in memory arrays 41 and 42, respectively, are connected to bitline sense amplifier 44-2.

Bitline sense amplifiers 43-i and 45-i are located on the left side of memory array 41 and the right side of memory array 42, respectively, and will be referred to as the end-cap bitline sense amplifiers hereinafter. As shown, each of the end-cap bitline sense amplifiers 43-i and 45-i are connected to one pair of bitlines in the memory arrays 41 and 42, respectively.

All bitline sense amplifiers in FIG. 2 are similar in that each bitline sense amplifier receives two pairs of bitlines. Since the end-cap sense amplifiers 43-i and 45-i only receive one pair of bitlines from the respective memory arrays, dummy bitlines (also referred to as end-cap bitlines) are used as the second pair of bitlines. For example, end-cap bitlines 401A and 403A are used as the second pair of bitlines for the end-cap bitline sense amplifiers 43-1 and 43-2, respectively.

As shown in FIG. 2, the bitline sense amplifiers 44-i are connected to every other pair of bitlines in memory arrays 41 and 42, while the alternate bitlines are connected to the end-cap bitline sense amplifiers 43-i and 45-i; hence the name "staggered sense amplifier" architecture. In this manner, half of the memory cells in memory array 42 are connected by bitline pairs (shown, for example, as 401C and 403C) to end-cap bitline sense amplifiers 45-i, while the other half of the memory cells are connected by bitline pairs (shown, for example, as 402B and 404B) to bitline sense amplifiers 44-i. The memory cells in memory array 41 are similarly connected to the bitline sense amplifiers 43-i and 44-i.

Typically, a memory chip consists of more memory arrays than those shown in FIG. 2. Such a memory chip would include additional memory array arrangements similar to that formed by the bitline sense amplifiers 44-i and memory arrays 41 and 42. Note that in such a chip, the end-cap arrangements shown in FIG. 2, i.e., the end-cap bitlines and the end-cap bitline sense amplifiers, are provided only once for each end of the overall memory block.

A specific memory location is selected by selecting the corresponding wordline and the appropriate pair of bitlines. As in any memory array, the wordlines in memory arrays 41 and 42 (not shown) extend across the array in the direction perpendicular to the bitlines. To read out a memory cell, one wordline is selected from among the wordlines in memory arrays 41 and 42. The selected word line activates one row of memory cells; however, only the memory cells connected to the selected bitline pair will be read.

Each bitline in memory arrays 41 and 42 is connected to a select transistor not shown. A bitline pair is selected by activating the corresponding select transistors. The activated select transistors provide a connection between the pair of bitlines and the input terminals of the corresponding bitline sense amplifier. In this manner a direct connection is provided between the selected memory cell and the input terminals of a bitline sense amplifier.

Upon sensing the state of the selected memory cell, the bitline sense amplifier provides signals on its output terminals representing the state of the selected memory cell. The output terminals of each of the bitline sense amplifiers are connected to a pair of data bus lines DB and $\overline{DB}$ via a second set of select transistor pairs not shown. These select transistors are part of a decoding scheme wherein by activating a pair of select transistors, a connection is made between the output terminals of a bitline sense amplifier and the corresponding pair of data bus lines.

The column decoding scheme activates a specific select transistor depending upon (i) the array within which the wordline is selected, hereinafter referred to as the selected array, and (ii) the selected bitline pair in the selected array. For example, if a wordline and the bitline pair 403C are selected from memory array 42, the pair of select transistors which connect the output terminals of the end-cap bitline sense amplifier 45-2 to the data bus lines $DB_R$ and $\overline{DB}_R$ are activated.

As in the DRAM configuration of FIG. 1, once the data is provided on the appropriate DB and $\overline{DB}$ lines, a second amplification is carried out. The I/O sense amplifiers 60 and 70 perform this task. The I/O sense amplifier 60 receives $DB_n/\overline{DB}_n$ lines at its input terminals and provides a signal representing the state of the sensed memory cell on its output terminal $DO_n$. The output terminal $DO_n$ is in turn fed to an output buffer circuit not shown.

Due to the staggering of the bitline sense amplifiers, a selection needs to be made between the $DB_L/\overline{DB}_L$ lines and $DB_R/\overline{DB}_R$ lines prior to amplification of the signals on these lines. Multiplexer 80 performs this selection in response to an asserted input signal <A> or <B> from the selected array 41 or 42, respectively. If input signal <A> is asserted, the signals on $DB_L/\overline{DB}_L$ lines are passed through for amplification. If input signal <B> is asserted, the signals on $DB_R/\overline{DB}_R$ lines are passed through for amplification.

I/O sense amplifier 70 then amplifies the signals on the selected data bus lines. I/O Sense amplifier 70 provides the amplified signal on its output terminal $DO_m$. The output terminal $DO_m$ is in turn fed to an output buffer not shown.

The initial sensing performed by the bitline sense amplifier is in the critical speed path (what is commonly referred to as the "address access time") of the memory chip. Thus, it is desirable to minimize the time delay associated with amplifying and transmitting the small signal associated with the selected memory cells. However, two factors hinder reducing the time delay. First, the area within which each bitline sense amplifier is physically laid out is limited to the pitch of two bitlines. As such, the drive capability of the bitline sense amplifiers is severely limited because the transistors in the bitline sense amplifiers cannot be made as large as desired.

Second, since the output terminals of the selected bitline sense amplifier are connected to the corresponding data bus lines, the selected bitline sense amplifier is required to drive the capacitive loading associated with the data bus lines. The data bus line capacitance increases as the length of the data bus line increases.

The impact of the first factor, namely the area limitation, is reduced by staggering the bitline sense amplifiers. Staggering the bitline sense amplifiers doubles the space within which each bitline sense amplifier is laid out, i.e., within a pitch of four bitlines rather than two. However, the time delay degradations due to the second factor is further exacerbated because of the additional data bus line routing required in providing both sets of data bus lines $DB_L/\overline{DB}_L$ and $DB_R/\overline{DB}_R$ to the multiplexer 80.

In order for the multiplexer 80 to carry out the selection function, either $DB_L/\overline{DB}_L$ lines or $DB_R/\overline{DB}_R$ lines need to be routed across a portion of the chip, as illustrated in FIG. 2. The additional routing significantly increases the interconnect capacitance on the routed data bus lines, thereby degrading the address access time.

Furthermore, unlike the read path represented by $DB_n/\overline{DB}_n$ lines and I/O sense amplifier 60, the read paths represented by $DB_L/\overline{DB}_L$ and $DB_R/\overline{DB}_R$ lines include multiplexer 80. The gate delay associated with multiplexer 80 causes additional time delay.

Therefore, the capacitive loading due to the additional routing of the $DB_L/\overline{DB}_L$ and $DB_R/\overline{DB}_R$ lines coupled with the gate delay associated with multiplexer 80, degrade the over all speed of the DRAM device. These drawbacks hinder achieving the desired device address access times, specially in high speed DRAM designs.

SUMMARY

In accordance with this invention, a DRAM with a staggered bitline sense amplifier configuration utilizes an Input/Output (I/O) data path scheme which reduces the time delay through and simplifies the I/O data path as compared to the prior art.

The DRAM includes a first memory array and a second memory array and two column decoding circuits. The first column decoding circuit is associated with the first memory array and is located on the outside edge of the first memory array. The second column decoding circuit is associated with the second memory array and is located on the outside edge of the second memory array. Each of the two column decoding circuits includes a group of internal sense amplifiers. Each of the internal sense amplifiers has a pair of input terminals and a pair of output terminals.

In the first column decoding circuit, the pairs of input terminals of all the internal sense amplifiers are connected to alternate pairs of bitlines $BL_a$ and $\overline{BL}_a$ in the first memory array via a first set of select transistor pairs. The pairs of output terminals of all the internal sense amplifiers in the first column decoding circuit are connected to a first pair of data bus lines $DB_a$ and $\overline{DB}_a$ via a second set of select transistor pairs.

Similarly, in the second column decoding circuit, the pairs of input terminals of all the internal sense amplifiers are connected to alternate pairs of bitlines $BL_b$ and $\overline{BL}_b$ in the second memory array via a first set of select transistor pairs. The pair of output terminals of all the internal sense amplifiers in the second column decoding circuit are connected to a second pair of data bus lines $DB_b$ and $\overline{DB}_b$ via a second set of select transistor pairs.

The DRAM further includes a first external sense amplifier and a second external sense amplifier. Each external sense amplifier has a pair of input terminals and an output terminal. The pairs of input terminals of the first and the second external sense amplifiers are connected to data bus lines $DB_a/\overline{DB}_a$ and $DB_b/\overline{DB}_b$, respectively.

The output terminals of the first and second external sense amplifiers are shorted together. Each of the first and second external sense amplifiers also has a third input terminal which receives a tristate signal. The tristate signal is used to place one of the two external sense amplifiers in tristate (high impedance) during each read cycle in order to prevent data contention on the shorted output terminals. The shorted output terminals provides the signal corresponding to the state of the memory location selected from either the first memory array or the second memory array via the corresponding column decoding circuit.

One feature of this invention is that the capacitive loading on the data bus lines $DB_a/\overline{DB}_a$ and $DB_b/\overline{DB}_b$ due to routing is minimized, thereby improving the time delay through the I/O data path.

Another feature of this invention is that the multiplexer needed in prior art to select between the two arrays is eliminated, and as such the time delay through the I/O data path is improved by removing the gate delay associated with the multiplexer.

These and other features and advantages of the present invention will become more apparent from the following description and the accompanying drawings.

DETAILED DESCRIPTION

While one embodiment of this invention will be described, other embodiments of this invention will be obvious in view of this description, which is illustrative only and not limiting.

Figure 1:
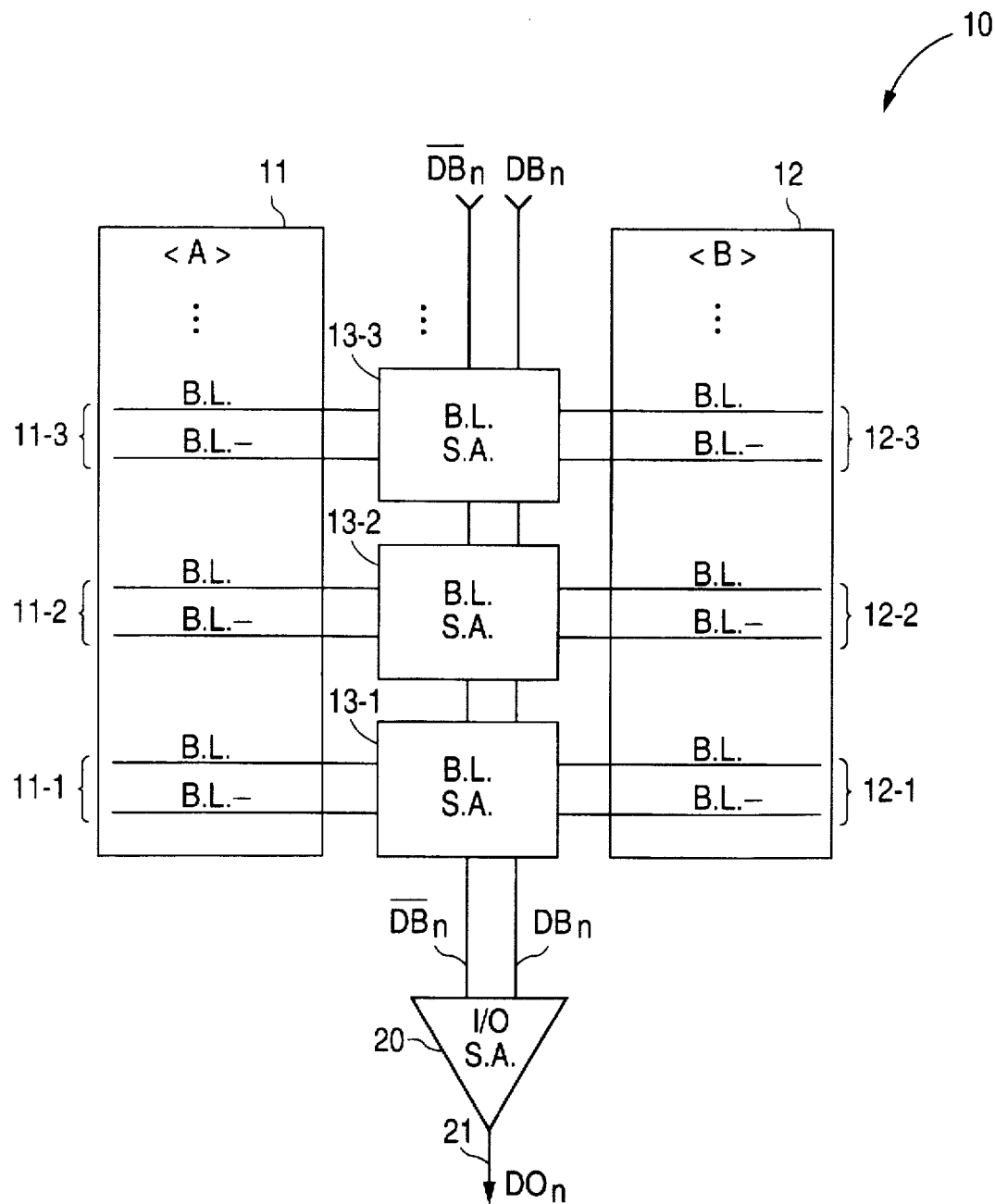
FIG. 1 illustrates a DRAM configuration in which a pair of memory arrays are shown with bitline sense amplifiers placed between the pair of memory arrays.
Figure 2:
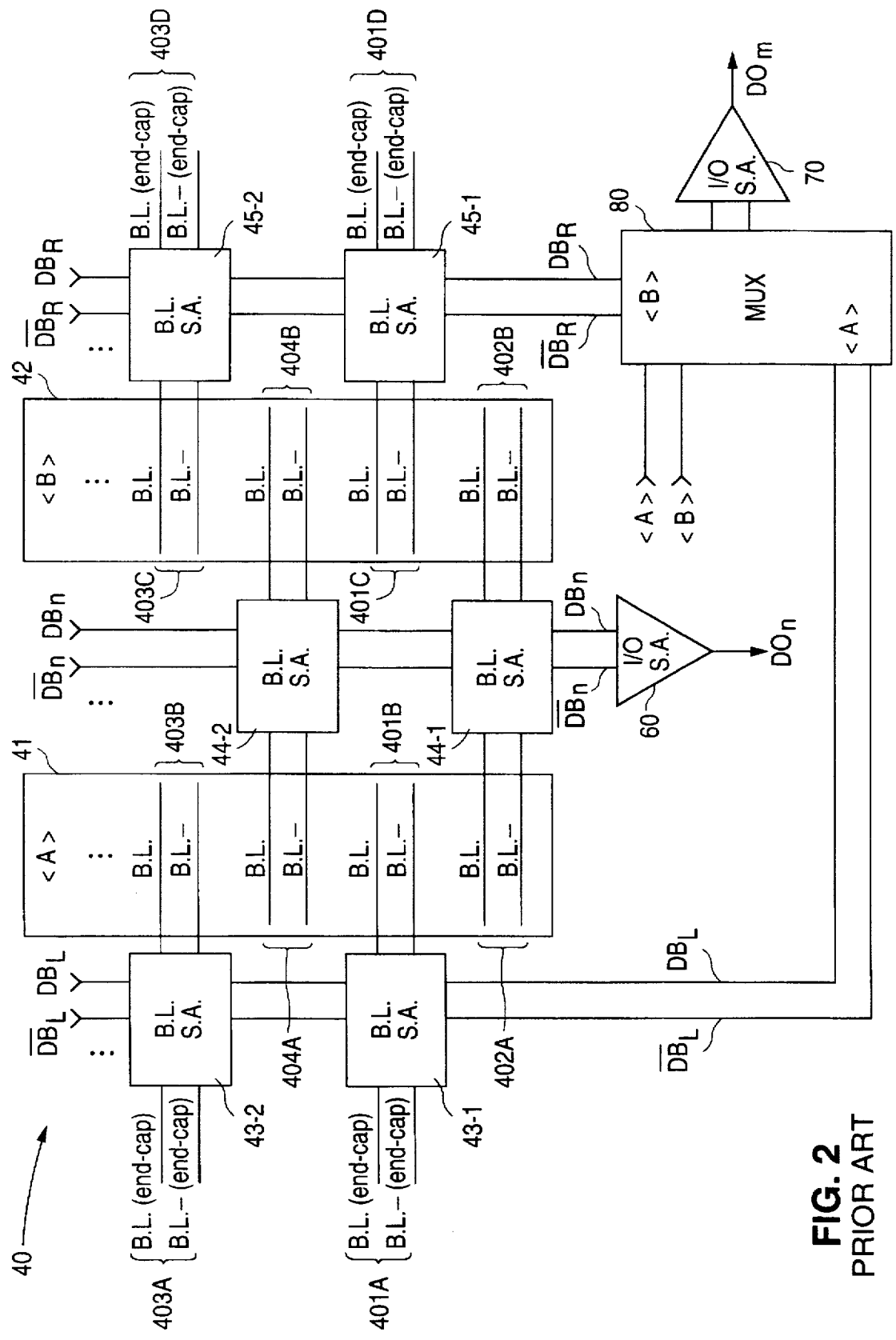
FIG. 2 illustrates another DRAM configuration in which the bitline sense amplifiers are organized in a staggered arrangement, and a multiplexer is used in the I/O data path.
Figure 3:
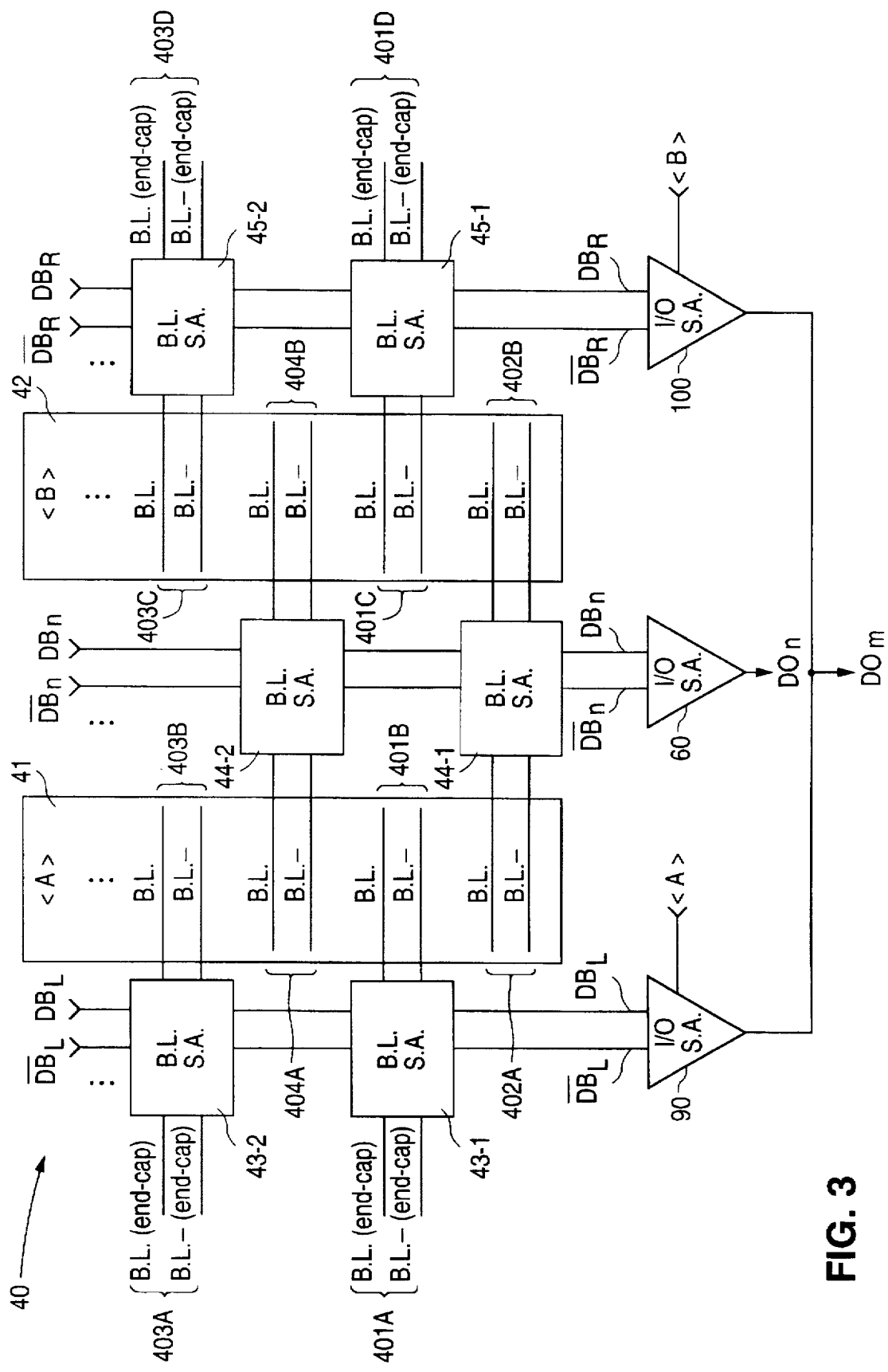
FIG. 3 illustrates the same DRAM configuration as in FIG. 2 but with new I/O circuitry in accordance with this invention.

Turning to FIG. 3, the structure of FIG. 3 is identical to the structure of FIG. 2, except that the multiplexer 80 and I/O sense amplifier 70 of FIG. 2 are eliminated and I/O sense amplifiers 90 and 100 are introduced. In this manner, each of the data bus lines $DB_L/\overline{DB}_L$ and $DB_R/\overline{DB}_R$ independently feed an I/O sense amplifier, similar to $DB_n/\overline{DB}_n$ lines.

By utilizing I/O sense amplifiers 90 and 100 rather than the multiplexer 80, the interconnect routing of both $DB_L/\overline{DB}_L$ and $DB_R/\overline{DB}_R$ lines is minimized. Accordingly, the speed degradation associated with the additional routing of these lines as shown in FIG. 2, is eliminated. In fact, all data bus lines are routed the same distance and thus possess identical interconnect capacitance. As such, the capacitive loading driven by the selected bitline sense amplifier will be the same for all selected bitline sense amplifiers.

Furthermore, the gate delay associated with multiplexer 80 in FIG. 2 is eliminated. Therefore, unlike the I/O configuration in FIG. 2, the time delay through all the data bus lines and the I/O sense amplifiers will be the same.

The I/O configuration of FIG. 3 however, raises two new issues. First, even though the I/O configuration of FIG. 3 eliminates the excess routing of the outer data bus lines, an equal amount of routing is required at the output terminals of I/O sense amplifiers 90 and 100 in order to short these two terminals together, as shown in FIG. 3. But, the area constraints and the resulting drive limitations of the bitline sense amplifiers, described above, do not exist with respect to the I/O sense amplifiers 60, 90 and 100. I/O sense amplifiers 60, 90 and 100 are: (i) laid out in the periphery region where no substantial area limitations are present, and (ii) are much fewer in number as compared to the bitline sense amplifiers. Therefore, any additional capacitance due to the excess routing of the output terminals of the I/O sense amplifiers 90 and 100, shown as output terminal $DO_m$, can be compensated for by properly designing the I/O sense amplifiers to provide the requisite drive.

Second, with the output terminals of the I/O sense amplifiers 90 and 100 shorted together, data contention on output terminal $DO_m$ needs to be avoided. To prevent data contention on the output terminal $DO_m$, the two I/O sense amplifiers 90 and 100 are modified as compared to the I/O sense amplifier 60. I/O sense amplifiers 90 and 100 have the capability of being placed in tristate (high impedance output terminal). Signals <A> and <B> are used to place I/O sense amplifiers 90 and 100 in tristate. If memory array <A> is selected, signal <B> is asserted placing I/O sense amplifier 100 in tristate. Similarly, I/O sense amplifier 90 is placed in tristate via signal <A> if memory array <B> is selected.

Figure 4:
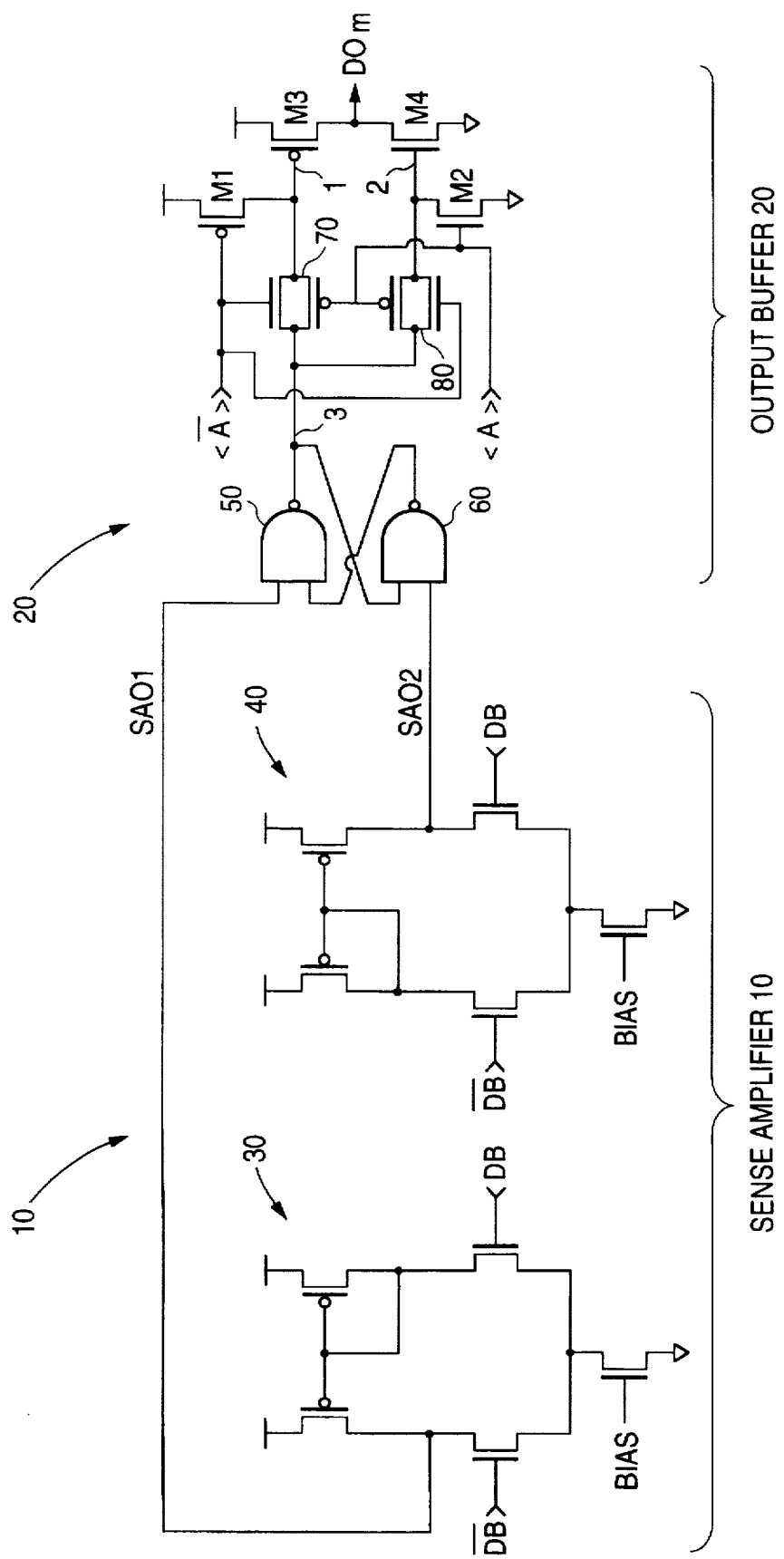
FIG. 4 shows one circuit implementation of the I/O sense amplifiers 90 and 100 of FIG. 3.

FIG. 4 shows one circuit implementation of the I/O sense amplifier 90 or 100 and the tristate scheme. The circuit of FIG. 4 comprises a sense amplifier stage 10 and an output buffer stage 20. The sense amplifier stage 10 comprises two single-ended differential amplifiers 30 and 40. The single-ended differential amplifiers 30 and 40 receive data bus lines DB and $\overline{DB}$ at their respective input terminals, and provide an output signal on output terminals SAO1 and SAO2, respectively. The differential amplifiers 30 and 40 amplify the signals on DB/$\overline{DB}$ lines independently. However, by reversing the DB/$\overline{DB}$ connection to the input terminals of the differential amplifiers 30 and 40, the signal on output terminals SAO1 and SAO2 are made to move in opposite directions, and as such additional amplification of the DB/$\overline{DB}$ signal is achieved.

Signals SAO1 and SAO2 are in turn provided as input signals to the output buffer stage 20. The output buffer stage 20 comprises a cross coupled pair of 2-input NAND gates, receiving SAO1 and SAO2 input signals and providing an output signal on terminal 3. Terminal 3 is fed to the source sides of the two CMOS pass gates 70 and 80. The CMOS pass gates 70 and 80 in combination with transistors M1 and M2 perform the tristate function. The drain sides of the two CMOS pass gates 70 and 80, marked as 1 and 2, respectively, in turn drive the gates of output driver devices M3 and M4, respectively.

Signals <A> and $\overline{<A>}$ place the output buffer 20 in tristate. When signals <A> and $\overline{<A>}$ are at logic high level and logic low level, respectively, the CMOS pass gates 70 and 80 are in the off state, while both transistors M1 and M2 are fully on. With the CMOS pass gates in the off state, transistor M1 will pull node 1 up to VCC potential, while transistor M2 will pull node 2 down to ground potential. With node 1 in a high state and node 2 in a low state both transistors M3 and M4 are shut off, and therefore the output terminal $DO_m$ is undriven and thereby in the high-impedance (tristate) state.

With signals <A> and $\overline{<A>}$ at logic low level and logic high level, respectively, the CMOS pass gates 70 and 80 are fully on, while both transistors M1 and M2 are shut off. Under this condition, the output terminal $DO_m$ will reflect the state of the DB and $\overline{DB}$ signals.

The circuit of FIG. 4 is one of many different ways of implementing the tristate function of the I/O sense amplifiers 90 and 100, and as such is illustrative only and not limiting.

While one embodiment of this invention has been described, other embodiments of this invention will be obvious in view of this description. The invention is further intended to include all variations and modifications falling within the scope of the appended claims.

What is claimed is:

1. A memory device comprising:

a first memory array and a second memory array;

a first column decoding circuit and a second column decoding circuit; and a first external sense amplifier and a second external sense amplifier each having an input terminal and an output terminal, said input terminal of said first external sense amplifier receiving a first signal corresponding to the state of a memory cell selected from said first memory array via said first column decoding circuit, said input terminal of said second external sense amplifier receiving a second signal corresponding to the state of a memory cell selected from said second memory array via said second column decoding circuit, and said output terminal of said first and second external sense amplifiers being arranged to drive the same output node, wherein said first and second external sense amplifiers are capable of being placed in tristate, and in each read cycle a memory cell in one of said first and second memory arrays is selected and the external sense amplifier corresponding to the memory array in which no memory cell is selected is placed in tristate to eliminate data contention on said output node.

2. A memory device as in claim 1 wherein said first column decoding circuit is located along the outside edge of said first memory array and said second column decoding circuit is located along the outside edge of said second memory array.

3. A memory device as in claim 2 wherein said first column decoding circuit comprises a group of internal sense amplifiers, each internal sense amplifier having an input terminal and an output terminal, said input terminal of all said internal sense amplifiers being connected to alternate bitlines in said first memory array via a first set of select transistors, said output terminal of all said internal sense amplifiers being connected to a first data bus line via a second set of select transistors, said first data bus line carrying said first signal and being connected to said input terminal of said first external sense amplifier.

4. A memory device as in claim 3 wherein said second column decoding circuit comprises a group of internal sense amplifiers, each internal sense amplifier having an input terminal and an output terminal, said input terminal of all said internal sense amplifiers being connected to alternate bitlines in said second memory array via a first set of select transistors, said output terminal of all said internal sense amplifiers being connected to a second data bus line via a second set of select transistors, said second data bus line carrying said second signal and being connected to said input terminal of said second external sense amplifier.

5. A memory device as in claim 4 further comprising a third external sense amplifier receiving on an input terminal a third signal corresponding to the state of a memory cell selected from one of said first and said second memory arrays via a third column decoding circuit, said third column decoding circuit being located between said first and second memory arrays.

6. A memory device as in claim 5 wherein said internal sense amplifiers in said third column decoding circuit are organized in a staggered arrangement with respect to said internal sense amplifiers in said first and second column decoding circuits.

7. A memory device as in claim 6 wherein said third column decoding circuit comprises a group of internal sense amplifiers, each internal sense amplifier having a first and a second input terminals and an output terminal, said first input terminal of all said internal sense amplifiers being connected to alternate bitlines in said first memory array via a first set of select transistors, said second input terminal of all said internal sense amplifiers being connected to alternate bitlines in said second memory array via a second set of select transistors, said output terminal of all said internal sense amplifiers being connected to a third data bus line via a third set of select transistors, said third data bus line carrying said third signal and being connected to said input terminal of said third external sense amplifier.

8. A memory device as in claim 4 wherein each internal sense amplifier in said first and second column decoding circuits has a second terminal connected to a dummy bitline.

9. A memory device as in claim 1 wherein said memory device is a Dynamic Random Access Memory.

10. A memory device as in claim 1 wherein said output node carries a signal which corresponds to the state of a memory cell selected from one of said first and second memory arrays.

11. A memory device as in claim 7 wherein said internal sense amplifiers in said first, second and third column decoding circuits comprise a pair of cross-coupled ratioed inverters.

12. A memory device as in claim 7 wherein said first, second and third external sense amplifiers comprise a pair of single-ended differential amplifiers.

13. A memory device as in claim 12 wherein each of said first and second external sense amplifiers further comprises an output buffer circuit which implements said tristate capability.

14. A memory array as in claim 1 wherein each of said first and second external sense amplifiers comprise a second input terminal used in placing said first and second external sense amplifiers in tristate.

15. A memory device comprising:
a first memory array and a second memory array;
a first column decoding circuit and a second column decoding circuit; and
a first external sense amplifier and a second external sense amplifier each having a pair of input terminals and an output terminal, said pair of input terminals of said first external sense amplifier receiving a first pair of signals corresponding to the state of a memory cell selected from said first memory array via said first column decoding circuit, said pair of input terminals of said second external sense amplifier receiving a second pair of signals corresponding to the state of a memory cell selected from said second memory array via said second column decoding circuit, and said output terminal of said first and second external sense amplifiers being shorted together,
wherein said external sense amplifiers are capable of being placed in tristate, and in each read cycle a memory cell in one of said first and second memory arrays is selected and the external sense amplifier corresponding to the memory array in which no memory cell is selected is placed in tristate to eliminate data contention on said shorted output terminals.

16. A memory device as in claim 15 wherein said first column decoding circuit is located along the outside edge of said first memory array and said second column decoding circuit is located along the outside edge of said second memory array.

17. A memory device as in claim 16 wherein said first column decoding circuit comprises a group of internal sense amplifiers, each internal sense amplifier having a pair of input terminals and a pair of output terminals, said pair of input terminals of all said internal sense amplifiers being connected to alternate pairs of bitlines $BL_a$ and $\overline{BL}_a$ in said first memory array via a first set of select transistor pairs, said pair of output terminals of all said internal sense amplifiers being connected to a first pair of data bus lines DB1 and $\overline{DB1}$ via a second set of select transistor pairs, said first pair of data bus lines carrying said first pair of signals and being connected to said pair of input terminals of said first external sense amplifier.

18. A memory device as in claim 17 wherein said second column decoding circuit comprises a group of internal sense amplifiers, each internal sense amplifier having a pair of input terminals and a pair of output terminals, said first pair of input terminals of all said internal sense amplifiers being connected to alternate pairs of bitlines $BL_b$ and $\overline{BL}_b$ in said second memory array via a first set of select transistor pairs, said pair of output terminals of all said internal sense amplifiers being connected to a second pair of data bus lines DB2 and $\overline{DB2}$ via a second set of select transistor pairs, said second pair of data bus lines carrying said second pair of signals and being connected to said pair of input terminals of said second external sense amplifier.

19. A memory device as in claim 18 further comprising a third external sense amplifier receiving on a pair of input terminals a third pair of signals corresponding to the state of a memory cell selected from one of said first and said second memory arrays via a third column decoding circuit, said third column decoding circuit being located between said first and second memory arrays.

20. A memory device as in claim 19 wherein said third column decoding circuit comprises a group of internal sense amplifiers, each internal sense amplifier having a first and a second pair of input terminals and a pair of output terminals, said first pair of input terminals of all said internal sense amplifiers being connected to alternate pair of bitlines in said first memory array via a first set of select transistor pairs, said second pair of input terminals of all said internal sense amplifiers being connected to alternate pair of bitlines in said second memory array via a second set of select transistor pairs, said pair of output terminals of all said internal sense amplifiers being connected to a third pair of data bus lines DB3 and $\overline{DB3}$ via a third set of select transistor pairs, said third pair of data bus lines carrying said third pair of signals and being connected to said pair of input terminals of said third external sense amplifier.

21. A memory device as in claim 20 wherein said internal sense amplifiers in said third column decoding circuit are organized in a staggered arrangement with respect to said internal sense amplifiers in said first and second column decoding circuits.

* * * * *